(12) United States Patent
Toba et al.

(10) Patent No.: US 8,963,290 B2
(45) Date of Patent: Feb. 24, 2015

(54) SEMICONDUCTOR DEVICE AND MANUFACTURING METHOD THEREFOR

(75) Inventors: Ryuichi Toba, Tokyo (JP); Yoshitaka Kadowaki, Tokyo (JP); Meoung Whan Cho, Yongin (KR); Seog Woo Lee, Hwasung (KR); Pil Guk Jang, Hwasung (KR)

(73) Assignees: Dowa Electronics Materials Co., Ltd., Tokyo (JP); Wavesquare Inc., Yongin (KR)

( * ) Notice: Subject to any disclaimer, the term of this patent is extended or adjusted under 35 U.S.C. 154(b) by 0 days.

(21) Appl. No.: 13/990,971

(22) PCT Filed: Dec. 28, 2010

(86) PCT No.: PCT/JP2010/007611
§ 371 (c)(1),
(2), (4) Date: Jun. 21, 2013

(87) PCT Pub. No.: WO2012/090252
PCT Pub. Date: Jul. 5, 2012

(65) Prior Publication Data
US 2014/0015105 A1    Jan. 16, 2014

(51) Int. Cl.
*H01L 33/36* (2010.01)
*H01L 29/34* (2006.01)
(Continued)

(52) U.S. Cl.
CPC .............. *H01L 29/34* (2013.01); *H01L 33/40* (2013.01); *H01L 21/02664* (2013.01);
(Continued)

(58) Field of Classification Search
CPC .......................... H01L 29/34; H01L 21/02664
USPC ...................................... 257/615, 99; 438/22
See application file for complete search history.

(56) References Cited

U.S. PATENT DOCUMENTS

2001/0045562 A1* 11/2001 Uemura et al. ................. 257/79
2008/0044937 A1   2/2008 Choi et al.
2010/0171135 A1   7/2010 Engl et al.

FOREIGN PATENT DOCUMENTS

| JP | A-07-045867 | 2/1995 |
|---|---|---|
| JP | 2001007394 A * | 1/2001 |

(Continued)

OTHER PUBLICATIONS

Feb. 1, 2011 International Search Report issued in International Application No. PCT/JP2010/007611.
(Continued)

*Primary Examiner* — Michael Trinh
*Assistant Examiner* — Damian A Hillman
(74) *Attorney, Agent, or Firm* — Oliff PLC

(57) ABSTRACT

The purpose of the present invention is to provide a good ohmic contact for an n-type Group-III nitride semiconductor. An n-type GaN layer and a p-type GaN layer are aequentially formed on a lift-off layer (growth step). A p-side electrode is formed on the top face of the p-type GaN layer. A copper block is formed over the entire area of the top face through a cap metal. Then, the lift-off layer is removed by making a chemical treatment (lift-off step). Then, a laminate structure constituted by the n-type GaN layer, with which the surface of the N polar plane has been exposed, and the p-type GaN layer is subjected to anisotropic wet etching (surface etching step). The N-polar surface after the etching has irregularities constituted by {10-1-1} planes. Then, an n-side electrode is formed on the bottom face of the n-type GaN layer (electrode formation step).

13 Claims, 14 Drawing Sheets

(51) Int. Cl.
*H01L 33/40* (2010.01)
*H01L 21/02* (2006.01)
*H01L 21/285* (2006.01)
*H01L 29/30* (2006.01)
*H01L 29/45* (2006.01)
*H01L 33/16* (2010.01)
*H01L 33/22* (2010.01)
*H01L 33/32* (2010.01)
*H01S 5/02* (2006.01)
*H01S 5/042* (2006.01)
*H01S 5/323* (2006.01)
*H01S 5/32* (2006.01)
*H01L 29/20* (2006.01)

(52) U.S. Cl.
CPC ......... *H01L 21/28575* (2013.01); *H01L 29/30* (2013.01); *H01L 29/452* (2013.01); *H01L 33/16* (2013.01); *H01L 33/22* (2013.01); *H01L 33/32* (2013.01); *H01S 5/0215* (2013.01); *H01S 5/0217* (2013.01); *H01S 5/0425* (2013.01); *H01S 5/32341* (2013.01); *H01S 5/3202* (2013.01); *H01L 29/2003* (2013.01)

USPC ..................................................... 257/615

(56) References Cited

FOREIGN PATENT DOCUMENTS

| JP | A-2001-007394 | | 1/2001 |
| JP | 2004071657 A | * | 3/2004 |
| JP | A-2004-071657 | | 3/2004 |
| JP | A-2005-197670 | | 7/2005 |
| JP | A-2007-273844 | | 10/2007 |
| JP | A-2008-047860 | | 2/2008 |
| JP | A-2008-235792 | | 10/2008 |
| JP | A-2009-054888 | | 3/2009 |
| JP | 2009231523 A | * | 10/2009 |
| JP | A-2009-231523 | | 10/2009 |
| WO | WO 2006/123580 A1 | | 11/2006 |
| WO | WO 2006123580 A1 | * | 11/2006 |

OTHER PUBLICATIONS

Jun. 3, 2014 Office Action issued in European Patent Application No. 10861317.5.

* cited by examiner

Top view is omitted.

SEMICONDUCTOR DEVICE AND MANUFACTURING METHOD THEREFOR

TECHNICAL FIELD

The present invention relates to a structure of a semiconductor device using a Group-III nitride semiconductor formed by epitaxial growth, and a manufacturing method for the semiconductor device.

BACKGROUND ART

Group-III nitride semiconductors, which are compound semiconductors typified by GaN, have a wide band gap, and therefore, they are widely used as materials for light-emitting devices, such as blue, green, and other color LEDs (light-emitting diodes), LDs (laser diodes), and the like, and power devices. Silicon, which typifies semiconductor materials, is generally used as a wafer having a large diameter that is obtained by cutting from a bulk crystal with a large diameter. However, for such compound semiconductors as mentioned above, it is extremely difficult to obtain a bulk crystal having a large diameter (for example, 4-inch dia or larger). Therefore, in manufacturing a semiconductor device using such a compound semiconductor, a wafer in which the compound semiconductor is heteroepitaxially grown on a substrate formed of a material dissimilar thereto is generally used. In addition, a p-n junction or a heterojunction which constitutes an LED or an LD can also be obtained by further carrying out an epitaxial growth thereon.

For example, as a material of an epitaxial growth substrate on which a GaN single crystal can be grown, sapphire, and the like, are known. With sapphire, a bulk single crystal having a large diameter can be relatively easily obtained, and by selecting the plane orientation therefor as appropriate, a GaN single crystal can be heteroepitaxially grown on a substrate made of a single crystal of sapphire. Thereby a wafer having a large diameter in which a GaN single crystal has been formed can be obtained.

Here, with a p-type GaN layer and an n-type GaN layer being formed on a sapphire substrate, a pn junction is formed, however, generally, it is difficult to obtain a good-quality p-type GaN layer, as compared to obtain an n-type GaN layer. Therefore, for this structure, a thick n-type GaN layer is generally formed on a sapphire substrate, and on the n-type GaN layer, a thin p-type GaN layer is formed by epitaxial growth in sequence. With this structure, since sapphire for use as the substrate is nonconductive, electrical contacts to the p-type GaN layer and the n-type GaN layer are often provided on the top side (on the side opposite to the substrate). Sapphire is transparent, and therefore, with a light-emitting device, luminescence can be taken out from the bottom side thereof (which structure is known as a flip chip structure).

FIG. 9(A) and FIG. 9(B) show a simplified manufacturing process for a light-emitting device having such structure. With this manufacturing method, as shown in FIG. 9(A), first, an n-type GaN layer 92 and a p-type GaN layer 93 are formed on a sapphire substrate 91 in sequence. Actually, between the n-type GaN layer 92 and the sapphire substrate 91, a buffer layer is often formed in order to improve the crystallinity of the n-type GaN layer 92, however, description of the buffer layer is omitted here. Thereafter, as shown in FIG. 9(B), the surface of the p-type GaN layer 93 is partially etched away to thereby form a region where the n-type GaN layer 92 is exposed, and in this portion, an n-side electrode 94 is formed, while, on the surface of the p-type GaN layer 93, a p-side electrode 95 is formed.

The material constitution of the electrode in such a structure is disclosed in, for example, Patent Document 1. In this document, it is disclosed that a structure in which, especially as a layer in the n-side electrode 94 that is to be contacted with the n-type GaN layer 92, a Cr or Cr alloy layer is formed by sputtering, and thereon an Au layer is formed through a Ti layer has a good ohmic contact characteristic on the n-type GaN layer 92. In addition, in Patent Document 2, it is disclosed that an alloy of Ti and Al has a good ohmic contact characteristic on the n-type GaN layer 92. In other words, by connecting an electrode having such structure to the n-type GaN layer 92, the electrode resistance can be lowered, and a light-emitting device having a good luminescent property can be obtained.

With the structure in FIG. 9(B), luminescence can be taken out from the bottom side, however, the region where the top side of the n-type GaN layer 92 is exposed as shown at right in FIG. 9(B) will not utterly contribute to the luminescence. Therefore, as a form which provides a higher luminescence efficiency, a structure in which the sapphire substrate used as the growth substrate is removed, and on the back side of the n-type GaN layer, the n-side electrode is formed has been adopted. FIGS. 10(A) to 10(C) illustrate a simplified manufacturing method for a light-emitting device having such structure.

With this manufacturing method, as shown in FIG. 10(A), an n-type GaN layer 92 and a p-type GaN layer 93 are first formed in sequence on the sapphire substrate 91 through a lift-off layer 96. Thereafter, as shown in FIG. 10(B), the lift-off layer 96 is removed by making a chemical treatment (chemical lift-off) or illuminating laser light (laser lift-off). Thereby, the sapphire substrate 91 and the n-type GaN layer 92 are separated from each other, resulting in the bottom face of the n-type GaN layer 92 being exposed. Thereby, as shown in FIG. 10(C), the n-side electrode 94 can be formed in a portion of the bottom face of the n-type GaN layer 92, and the p-side electrode 95 can be formed on the top face of the p-type GaN layer 93. This structure can provide a large effective light-emitting area as compared to that obtained with the structure in FIG. 9(B), thereby a higher luminescence efficiency can be achieved. Further, since there is no need for taking out light from the top face of the p-type GaN layer 93, it is also possible that the area of the p-side electrode 95, which is not transparent to the light, is increased to thereby form the p-side electrode 95 over a wider range within the surface of the p-type GaN layer 93. Generally, since the p-type GaN layer 93 has a high electrical resistivity as compared to that of the n-type GaN layer 92, increasing the area of the p-side electrode 95 is effective for reducing the resistance of the electrode portion. Further, if, for the p-type ohmic electrode, which is to be contacted with the p-type GaN layer, a material having a high reflectivity for the luminescence wavelength is used, the light from the light-emitting layer can be reflected to the opposed face side, whereby a still higher luminescence efficiency can be obtained.

Patent Document 1: Japanese Unexamined Patent Application Publication No. 2005-197670
Patent Document 2: Japanese Unexamined Patent Application Publication. No. Hei 7-45867

DISCLOSURE OF THE INVENTION

Problems to be Solved by the Invention

However, the GaN, which is a compound semiconductor is composed of two different elements, unlike the Group-IV semiconductor, such as silicon. Therefore, in the crystal structure, there exists a crystal plane having an orientation or a polarity. For example, the {0001} planes of a GaN crystal having a wurtzite structure are so-called polar planes, two different planes, i.e., a (0001) Ga polar plane, which is constituted by Ga atoms alone, and a (000-1) N (nitrogen) polar plane, which is constituted by N (nitrogen) atoms alone, being formed in different orientations. With a GaN single crystal, assuming that the plane on the top side is such (0001) Ga polar plane (hereafter, to be expressed as a Ga polar plane or also a Ga-Polar), the plane on the bottom side that is in parallel with the plane on the top side will be always a (000-1) N polar plane (hereafter, to be expressed as a nitrogen polar plane or also an N-Polar). Since these two types of planes are quite different from each other in constitution element, the natures thereof are greatly different from each other. Therefore, for example, in the structure shown in FIG. 9(B) or FIG. 10(C), if the top face of the n-type GaN layer 92 is a Ga polar plane, the bottom face will be a nitrogen polar plane. In this case, the n-type electrode formed on the top face of the n-type GaN layer and that formed on the bottom face are different from each other in chemical reactivity, electrical characteristics, and the like.

Actually, in the case where an n-type GaN layer is to be heteroepitaxially grown on a sapphire substrate, a sapphire substrate with a (0001) plane orientation grown along the direction of the c-axis is often used. Although the crystal structure of sapphire is of the rhombohedral crystal family, it is generally approximately expressed as that of the hexagonal crystal family. In this case, generally, the top face of the n-type GaN layer 92 in FIG. 9(B) or FIG. 10(C) will be a (0001) Ga polar plane, while the bottom face thereof will be a (000-1) N polar plane.

About this, it has been indicated that the n-side electrode as mentioned in either of Patent Documents 1 and 2 is effective only for the top face of the n-type GaN layer 92 formed on the sapphire substrate 91 (the plane on the side opposite to the sapphire substrate 91, i.e., the Ga polar plane) as shown in FIG. 9. On this point, the inventors of the present invention have made an examination to confirm that, for the bottom face (the nitrogen polar plane) of the n-type GaN layer 92 as shown in FIG. 10(C), the electrode for the n-type layer as disclosed in Patent Document 1 has no ohmicity, while the electrode for the n-type layer as disclosed in Patent Document 2 is highly resistant, having no heat endurance.

Consequently, it has been difficult to obtain an electrode having a good property on the plane on the epitaxial growth substrate side of the n-type Group-III nitride semiconductor layer formed on the epitaxial growth substrate. In other words, for actual semiconductor devices, a good ohmic junction could not have been provided to the n-type Group-III nitride semiconductor in some cases.

In view of the above problems of the prior art, the present invention has been made to provide solutions to such problems.

Means for Solving the Problems

In order to solve the problems as described above, the present invention provides the following scheme:

According to an aspect of the present invention, there is provided a semiconductor device, including a plurality of electrodes, one electrode of the plurality of electrodes being formed on a surface constituted by a semi-polar plane on the side of one principal plane in an n-type Group-III nitride semiconductor layer, and another electrode of the plurality of electrodes that is connected to the one electrode being formed on the side of the other principal plane in the n-type Group-III nitride semiconductor layer. Further, the semi-polar plane is constituted by {10-1-1} planes.

According to another aspect of the present invention, there is provided a semiconductor device, in which the surface is formed by anisotropic chemical etching of a (000-1) N polar plane of the n-type Group-III nitride semiconductor, and the surface of the n-type Group-III nitride semiconductor device has irregularities constituted by the semi-polar plane.

According to another aspect of the present invention, there is provided a semiconductor device, in which the n-type Group-III nitride semiconductor layer is a single crystal which has been formed by epitaxial growth on a sapphire substrate, and the (000-1) N polar plane is a plane on the side of the sapphire substrate, the plane having been obtained by separating between the n-type Group-III nitride semiconductor layer and the sapphire substrate after the epitaxial growth.

According to another aspect of the present invention, there is provided a semiconductor device, in which the one electrode has a structure in which titanium (Ti), nickel (Ni), and gold (Au) layers have been sequentially laminated on the semi-polar plane of the n-type Group-III nitride semiconductor layer.

According to another aspect of the present invention, there is provided a semiconductor device, in which an electric current is caused to flow from the one electrode in a direction perpendicular to the principal plane in the surface for operation thereof.

According to another aspect of the present invention, there is provided a semiconductor device, in which the one electrode is formed on the surface constituted by a semi-polar plane on the side of one principal plane in the n-type Group-III nitride semiconductor layer, and the another electrode connected to the one electrode is formed on the side of the Group-III polar plane, being the other principal plane (0001), in the n-type Group-III nitride semiconductor layer.

According to another aspect of the present invention, there is provided a semiconductor device, in which the another electrode is formed on a bottom face of a recess structure formed on the side of the other principal plane in the Group-III nitride semiconductor.

According to another aspect of the present invention, there is provided a semiconductor device, in which the another electrode has a structure in which chromium (Cr), nickel (Ni), and gold (Au) layers are sequentially laminated on the (0001) Group-III polar plane.

According to an aspect of the present invention, there is provided a manufacturing method for a semiconductor device in which an n-type Group-III nitride semiconductor layer is used, including: a growth step of epitaxially growing the n-type Group-III nitride semiconductor layer on a growth substrate; a lift-off step of separating between the n-type Group-III nitride semiconductor layer and the growth substrate for exposing a plane on the side of the growth substrate in the n-type Group-III nitride semiconductor layer; a surface etching step of anisotropic chemical etching on the plane on the side of the growth substrate in the n-type Group-III nitride semiconductor layer for forming a surface in which a semi-polar plane is exposed in the plane on the side of the growth substrate in the n-type Group-III nitride semiconductor layer; and an electrode formation step of forming an electrode on the surface.

According to another aspect of the present invention, there is provided a manufacturing method for a semiconductor device, in which the anisotropic etching in the surface etching step is wet etching using an alkaline solution.

According to another aspect of the present invention, there is provided a manufacturing method for a semiconductor device, in which, in the growth step, the n-type nitride semiconductor layer is formed on the growth substrate through a lift-off layer; and in the lift-off step, by selectively etching the lift-off layer, the n-type Group-III nitride semiconductor layer and the growth substrate are separated from each other.

Advantages of the Invention

The present invention is schemed as described above, whereby, also on the plane on the side of the growth substrate, a good ohmic junction can be provided to an n-type Group-III nitride semiconductor.

BEST MODE FOR CARRYING OUT THE INVENTION

Figure 1A:
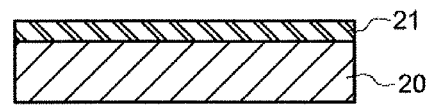
FIG. 1(A) to FIG. 1(G) are sectional views for the steps illustrating the manufacturing method for a semiconductor device according to an embodiment of the present invention.

Hereinbelow, a semiconductor device according to an embodiment of the present invention will be explained. With this semiconductor device, an electrode is formed at least on a semi-polar plane of an n-type Group-III nitride semiconductor.

Here, the polar plane, the non-polar plane, and the semi-polar plane will be briefly explained. Any nitride semiconductor single crystal is provided with a structure of the wurtzite-type hexagonal crystal family, and in the c-axis direction, has a form in which the Group-III element plane and the nitrogen element plane are alternately laminated. The bonding is somewhat ionic, thereby spontaneous polarization being generated, and if a distortion is applied to the crystal, piezoelectric polarization is also generated. Therefore, the (0001) Group-III element plane and the (000-1) N (nitrogen) plane differ in the polarization condition provided. On the other hand, with a plane parallel to the c-axis, the Group-III element and the nitrogen element are exposed to the surface in a ratio of 1 to 1, thereby the polarization being cancelled, resulting in a so-called non-polar plane being produced which apparently has no polarity. Them-planes {10-10} and the a-planes {11-20} come thereunder. The plane which is angular to the c-axis (c-plane) is a semi-polar plane, and, for example, the {11-22} plane, the {20-21} plane, the {0-1-3} plane, and the {10-1-1} plane come thereunder.

The (0001) Group-III polar plane is expressed as the Ga polar plane for convenience, and even if an expression of Ga polar plane is given, the surface may be a plane containing Al, In, or the like, besides Ga.

By specifying the electrode forming plane to be a semi-polar plane, the ohmic property can be improved as can be confirmed in the later described Example. The reason why such improvement is provided can be considered as follows: To the contact resistance is related the bending of the band structure of the semiconductor at the interface between the electrode and the semiconductor layer. It is obvious that, to such band structure bending, the polarity of the semiconductor surface is greatly related. Therefore, in the case where a certain one type of electrode material is selected, there will be caused a phenomenon in which the ohmic property can be obtained on one polar plane alone, or the ohmic property cannot be obtained on either polar plane. The semi-polar plane has a different selectivity for electrode material, when compared to the polar plane, and a metal constitution different from that of the polar plane may provide a good ohmic property.

On the other hand, a Group-III nitride semiconductor is generally formed by heteroepitaxial growth on the substrate, and from the viewpoint of obtaining good properties, the growth plane cannot be freely selected. At present, in order to reduce the influence of the polarization, development of the epitaxial technology for growing on the (10-10) plane (m-plane), which is a non-polar plane, and the (20-21) semi-polar plane is being progressed, however, there are problems about crystallinity, and the like, and thus the (0001) c-plane is generally used. Then, in the present embodiment, as explained below, in order to provide good properties for a grown Group-III nitride semiconductor, the growth plane itself is specified to be a polar plane, however, by forcedly exposing a semi-polar plane, the electrode is directly contacted with the semi-polar plane.

FIG. 1(A) to FIG. 1(G) are sectional views for the steps illustrating the manufacturing method for such semiconductor device. With this semiconductor device 10, as is the case with an example in FIGS. 10(A) to 10(C), an n-type GaN layer 11 is formed on a sapphire substrate (growth substrate) 20 by heteroepitaxial growth; the surface of the n-type GaN layer 11 on the side where the sapphire substrate 20 has been removed is changed into a semi-polar plane by anisotropic etching; and an n-side electrode (one electrode) 12 is formed so as to be in contact with the surface thereof. The surface on which the n-side electrode 12 is formed is constituted by a semi-polar plane, however, this fact does not mean that the surface itself is a flat one, and the flat surface provides a semi-polar plane. What is meant is that the surface is constituted by fine irregularities rather than a flat surface, and micro surfaces constituting such irregularities provide a semi-polar plane.

On the sapphire substrate 20, which is given as a growth substrate in FIG. 1(A), a metal chromium (Cr) layer having a film thickness of, for example, 20 nm or so is formed as a lift-off layer 21 by such a method as the sputtering method or the vacuum vapor deposition method. As the sapphire substrate 20, in order to form a single crystal of GaN thereon, a single crystal which principal plane is a c-plane of a pseudo hexagonal crystal structure is preferably used in particular. The growth substrate and the lift-off layer are not limited to those as described above. As the growth substrate, a substrate, such as an AlN template, or the like, may be used.

Thereafter, as disclosed in Japanese Unexamined Patent Application Publication No. 2009-54888, the above step may be followed by a nitriding treatment to provide a high temperature of 1040° C. or over in an ammonia atmosphere, for example. Thereby, the surface of the lift-off layer 21 and the vicinity thereof are nitrided to become a chromium nitride layer. It is possible to set the thickness of this chromium nitride layer by adjusting the thickness of the grown film of Cr, the treatment time, the temperature, and the like.

Figure 1B:
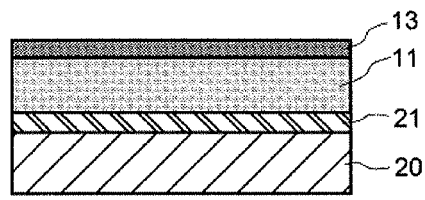

Thereafter, in FIG. 1(B), as disclosed in Japanese Unexamined Patent Application Publication No. 2009-54888, the n-type GaN layer 11 and a p-type GaN layer 13 are sequentially deposited on the lift-off layer 21 (the growth step). Here, the light-emitting layer is omitted, however, such layers, as those of the single quantum well structure, the multiple quantum well structure, and the like, are located between the n-type layer and the p-type layer. Further, the n-type and the p-type layer are not limited to the GaN crystal, but they may be of $Al_xIn_yGa_zN$ (x+y+z=1), or the like. The film formation is performed by, for example, the MOCVD method or the MBE method, and in the n-type GaN layer 11, an impurity, which provides a donner, is doped, while in the p-type GaN layer 13, an impurity, which provides an acceptor, is doped. As disclosed in Japanese Unexamined Patent Application Publication No. 2009-54888, and the like, on the chromium nitride layer, it is possible to grow the n-type GaN layer 11 and the p-type GaN layer 13 which have a minimum amount of crystal defect. Here, on the c-plane of the sapphire substrate 20, the growth is generally performed in the [0001] Ga orientation. In other words, the surface (top) of the n-type GaN layer 11, or the surface (top) of the p-type GaN layer 12, which has been grown thereon, provides a (0001) Ga plane. Further, the surface on the side where it is closer to the growth substrate provides a (000-1) N polar plane.

Figure 1C:
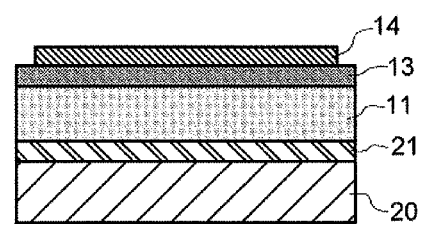

Next, as shown in FIG. 1(C), on the surface (top) of the p-type GaN layer 13, a p-side electrode 14 is formed. As the p-side electrode 14, a material, such as Ag, can be used. Thereafter, the photolithography is implemented by using the etching method, or the like, for patterning the p-side electrode 14. The patterning of the p-side electrode may be performed by the lift-off method. The material of Ag permits a good ohmic contact to be formed on the p-type GaN layer (the Ga polar plane), and particularly since it exhibits a reflectivity as high as 85% or over in the visible light region, it reflects light from the light-emitting layer to the luminous surface side, as shown in FIG. 11(G), thereby contributing to an increased efficiency of the light-emitting device.

Figure 1D:
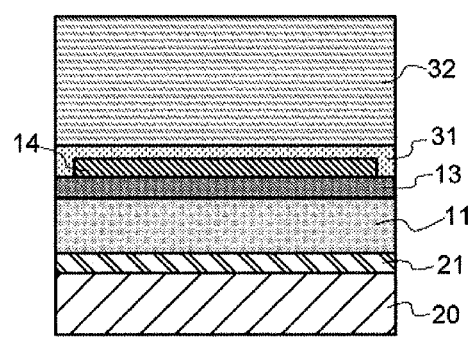

Next, as shown in FIG. 1(D), as a supporting structure portion for use in the lift-off step and the subsequent, a copper block 32, for example, is connected to the entire top face through a cap metal 31. As the cap metal 31, such a material as Ni/Au can be used. The supporting structure portion may be formed by using the dry plating method or the wet plating method, or by the bonding method, which uses a bonding material in between the supporting structure portion and the cap metal. Further, the material of the supporting structure portion may be a metal, an alloy, or a semiconductor having a conductivity.

Figure 1E:
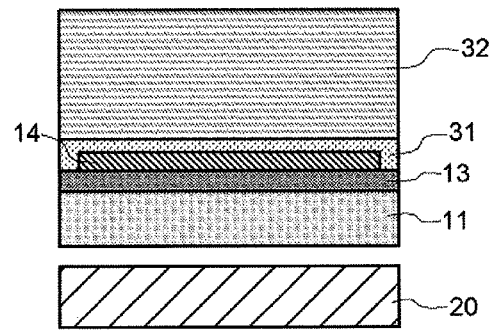

Thereafter, by making a chemical treatment, the lift-off layer 21 is removed (the lift-off step). By making a selective wet etching treatment, as shown in FIG. 1(E), the lift-off layer 21 alone can be selectively removed with no effect being had on the n-type GaN layer 11, the p-type layer 13, the supporting structure portion, and the like. This step is the same as that of the chemical lift-off as disclosed in Japanese Unexamined Patent Application Publication No. 2009-54888, and the like. This step causes the bottom face of the n-type GaN layer 11 to be exposed. This surface provides a (000-1) N polar plane, contrarily to the top face of the n-type GaN layer 11.

Next, the lamination structure made up of the n-type GaN layer 11, the bottom face of which has been exposed, and the p-type GaN layer 13, is subjected to anisotropic wet etching (the surface etching step). Here, the anisotropic wet etching is different from the etching for the purposes of removing the lift-off layer and cleaning the surface, which uniformly etches away the surface. In the present invention, anisotropic etching is defined as etching to be performed in such a way that the semi-polar plane is caused to be shown up to the polar plane. In other words, in the present invention, the semi-polar plane is a plane the surface of which can be formed by etching the polar plane, and which is constituted by, for example, a group of {10-1-1} planes.

For such anisotropic wet etching, an alkaline etchant, such as a potassium hydroxide (KOH) solution, a sodium hydroxide (NaOH) solution, or an alkaline solution prepared by mixing of these, may be used. As the solvent, water ($H_2O$) or glycol may be used. In operation, the $OH^-$ ion oxidizes the Group-III atom (Ga or Al) in the GaN or AlGaN layer to thereby cause etching. Especially in the case of GaN, there exist three nitrogen atoms under the Ga atom on the Ga polar plane side, and therefore the $OH^-$ ion cannot oxidize the Ga atom. On the other hand, on the nitrogen polar plane side, there exists only one nitrogen atom under the Ga atom, whereby the OH can oxidize the Ga atom. By making an anisotropic wet etching treatment using such a strong alkaline etchant under a proper condition, such as heating, the bottom face (the nitrogen polar plane ((000-1) N plane)) is selectively etched, and on the surface, there are formed a number of convexities in the shape of a six-sided pyramid, which have a hexagonal bottom face, being derived from the hexagonal crystal. For the above-mentioned reason, such anisotropic etching is caused on the nitrogen polar plane, and the Ga polar plane will not substantially be etched. On the Ga polar plane, if there is a dislocation, the effect of this etching can be observed as a pit in the shape of a six-sided pyramid.

Figure 1F:
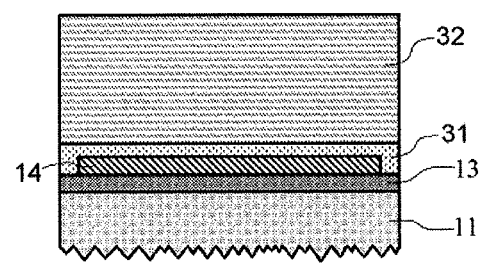
Figure 2A:
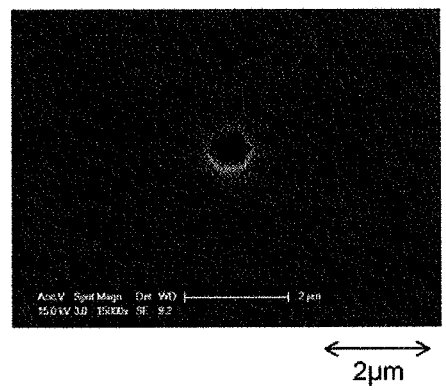
FIG. 2(A) and FIG. 2(B) are SEM photos of a GaN surface after anisotropic etching on the polar planes, FIG. 2(A) being an SEM photo of the Ga polar plane, and FIG. 2(B) being that of the N polar plane.
Figure 2B:
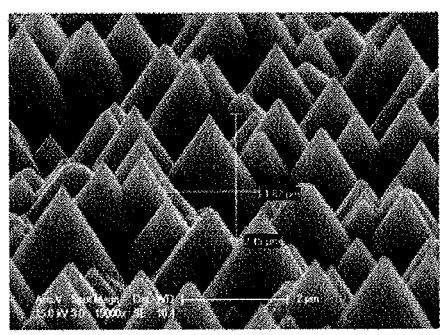

FIG. 2(A) and FIG. 2(B) show photos taken by scanning electron microscope (SEM) after such etching of the Ga polar plane and the nitrogen polar plane, respectively. As can be seen from FIG. 2(A), the shape of a six-sided pyramid provides a hexagonal bottom face in the (000-1) plane, with six {10-1-1} planes being developed at an angle of 62° with respect to the bottom face. Whether the plane developed is a (10-1-1) plane or not can be determined by finding the angle of the side face with respect to the bottom face from the shape observed by the SEM. For example, in the case where the device section is observed in a [10-10] direction, the boundary surface between the n-type GaN layer 11 and the n-side electrode (one electrode) 12 provides a sawtooth shape having an angle of approx. 62° to the n-type GaN layer 11 side. As shown in FIG. 1(F) and FIG. 2(B), after the aforementioned etching, the surface exhibits an irregular geometry constituted by six {10-1-1} planes.

Since the surface has an irregular geometry constituted by six {10-1-1} planes, the effective surface area is approx. double as large as that of the flat nitrogen polar plane, regardless of the size of the irregularities. Thereby, even if the dimension of the electrode along the direction of the flat surface remains unchanged, the effective area of contact with the n-type electrode is increased, which is effective to reduce the value of contact resistance. The size of the irregularities can be controlled by adjusting the concentration of the etchant, the temperature, and the time, and therefore, it is preferable to provide the size which is suitable not only for the above-mentioned reduction in contact resistance, but also for improvement of the efficiency of light taking-out on the basis of the Snell's law. For example, the size of the irregularities is preferably such that the six-sided pyramid has a height of 0.3 to 4.5 μm.

Figure 1G:
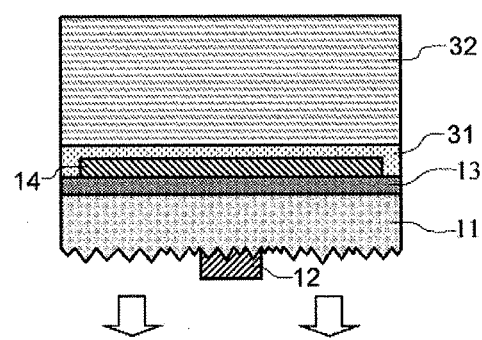

Next, as shown in FIG. 1(G), on the bottom face of the n-type GaN layer 11 in this state (the semi-polar plane after the anisotropic etching), a Ti/Ni/Au multi-layer (a structure in which Ti, Ni, and Au layers are laminated in this order), for example, is formed as the n-side electrode (one electrode) 12 (the electrode formation step). This formation is preferably performed by, for example, the sputtering method or the vacuum vapor deposition method. The film formation method and the patterning method are the same as those for the p-side electrode 14. The surface of the n-type GaN layer 11 is constituted by the semi-polar plane, as described above, and therefore, the ohmicity between the n-side electrode 12 and the n-type GaN layer 11 is good, and the contact resistance can be reduced.

Generally, the electrical resistivity of the p-type GaN layer 13 is higher than that of the n-type GaN layer 11. Therefore, in order to alleviate the effect of the electrode resistance in the operation of the above semiconductor device, it is preferable to provide a structure in which the area of the p-side electrode 14 is increased while that of the n-side electrode 11 is decreased, as shown in FIG. 1(G). In this case, by providing a structure in which luminescence is not taken out from the side of the p-side electrode 14 (by causing the p-side electrode to reflect it), and taken out from the side of the n-side electrode 12, which has a smaller area, a light-emitting diode (light-emitting device) having a small electrode resistance and a high luminescence efficiency can be obtained. As such, the above structure, which allows the resistance to be reduced on the side of the n-side electrode 12, having a smaller area, is extremely effective.

With the manufacturing method as illustrated in FIGS. 1(A) to 1(G), the n-type layer and the p-type layer constituting the semiconductor layer are sequentially grown on the growth substrate, which is followed by removing the growth substrate. The reason why such a step is taken is that, after forming a laminate structure of the p-type layer and the n-type layer, the p-side electrode and the n-side electrode are to be provided on the different surface sides of the semiconductor layer, respectively. In the case where this semiconductor device is a light-emitting diode or laser diode which utilizes this pn junction, such a structure lowers the electrode resistance, and theoretically, a low forward resistance and a high luminescence efficiency can be achieved. It is obvious that such a structure is effective for not only the light-emitting diode and the laser diode, but also for the whole semiconductor device which operates with a current flowing in a direction perpendicular to the principal plane of this semiconductor layer. This is also true even when another layer is formed between the n-type layer and the p-type layer. However, actually, there has been a problem that, on the exposed nitrogen polar plane of the n-type layer, a good ohmic contact cannot be formed, but, by making an anisotropic etching operation to forcedly transform the exposed surface into a semi-polar plane, the problem of how to create a good ohmic contact has been solved.

In addition, by the above manufacturing method, a number of irregularities are formed on the surface where the n-side electrode 12 and the n-type GaN layer 11 are to be in contact with each other, thereby the practical contact area being increased. Thereby, it is obvious that not only the contact resistance can be reduced, but also the so-called anchoring effect of the irregularities can enhance the adherence between the n-side electrode 12 and the n-type GaN layer 11.

Further, as described in, for example, the non-Patent Document 1: "30% external quantum efficiency from surface textured, thin-film light-emittingdiodes", Appl. Phys. Lett. 63 (1993) 2174, by I. Schnitzer, et al., for light-emitting diodes, the light taking-out efficiency can be enhanced by forming irregularities on the luminous surface. By the above manufacturing method, the n-side electrode can be formed in a portion of the surface having irregularities after forming the irregularities, and therefore the process is simple, with the advantages thereof being obtained simultaneously.

Further, in the above lift-off step, the chemical lift-off has been used, however, another method may be used, so long as the same structure can be formed. For example, instead of the chemical lift-off, the laser lift-off may be used.

Further, in the above example, the case where GaN is used as the Group-III nitride semiconductor has been described, however, for the crystal structure related to the polarity, especially for the structure of the (000-1) N plane and the formation of the semi-polar plane, the same discussion can be applied to other Group-III nitride semiconductors, such as AlGaN and AlInGaN. Therefore, it is obvious that the structure and the manufacturing method as described above are also effective for these. It is preferable that, as a Group-III element in the Group-III nitride semiconductor forming the electrode, Ga be contained, and more preferably Ga is contained by 30% or over. Further, in the above example, it is assumed that irregularities are produced on the surface on which the electrode is to be formed, and the microscopic surfaces constituting those irregularities provide a semi-polar plane, however, also in the case where the entire surface on which the electrode is to be formed is constituted by a semi-polar plane (in such a case where the GaN crystal is physically cut along the semi-polar plane), the electrode having the above structure is effective.

Next, a modification of the above semiconductor device or the manufacturing method therefor will be explained. In this modification, the n-side electrode is divided into two, i.e., an n-side first electrode and an n-type second electrode, and the latter is provided with the same structure as described above. This n-type second electrode (one electrode) is formed on the surface constituted by the semi-polar plane on the side of one principal plane of the n-type GaN layer as described above. On the other hand, the n-side first electrode (another electrode) is formed on the side of the other principal plane of the n-type GaN layer. Especially, the n-side first electrode is formed on the bottom face of a recess structure produced on the side of the other principal plane. With such n-type second electrode and n-side first electrode, an ohmic connection can be provided to the n-type GaN layer on both principal plane sides of the n-type GaN layer. Thereby, the total contact area between the n-type layer and the n-side electrode is increased for further reducing the electrode resistance, and increasing the effective light-emitting area.

FIGS. 3(A) to 3(E), FIGS. 4(F) to 4(I), and FIGS. 5(J) and 5(K) are top views (on top side) and sectional views (on bottom side) illustrating the manufacturing method for this semiconductor device. Here, the sectional view is that in a place where the n-side electrode is formed.

Figure 3A:
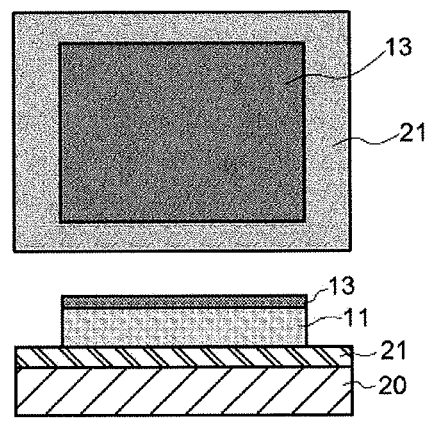
FIG. 3(A) to FIG. 3(E) are a first set of figures giving a top view (upper side) and a sectional view (lower side) for the respective steps illustrating a modification of the manufacturing method for a semiconductor device according to an embodiment of the present invention.

First, as shown in FIG. 3(A), in the same manner as described above, an n-type GaN layer 11 and a p-type GaN layer 13 are sequentially deposited on a sapphire substrate 20 through a lift-off layer 21 (the growth step). Thereafter, on the p-type GaN layer 13, a mask is formed, and by dry etching, the growth layer in the region other than the device region is removed, and a separation groove is formed to permit the device to be separated into portions (the separation groove formation step).

In this separation groove formation step, if apart of the sapphire substrate 20 is exposed with a portion of the lift-off layer 21 being removed by dry etching, the portion of the lift-off layer 21 that has been removed is filled with a filler material (not shown). This filler material is a material which can be etched away together with the lift-off layer 21 in the later lift-off step, and may be the same material as that of the lift-off layer 21. This is a measure for securing the path for etching the lift-off layer 21 even after formation of the insulating layer 43.

Figure 3B:
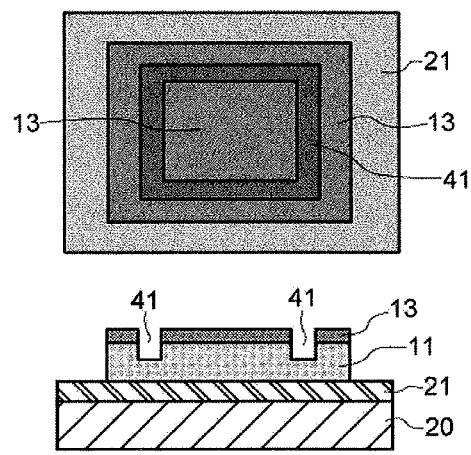

Next, as shown in FIG. 3(B), from the surface of the p-type GaN layer 13, a groove 41 is formed which reaches the n-type GaN layer 11. The groove 41 is annular (rectangular annular) when viewed from the top thereof, and the depth thereof is specified to reach the middle of the n-type GaN layer 11 after penetration through the p-type GaN layer 13. For making the current density to be more uniform, the rectangular annular geometry of the groove 41 may be modified into such a shape as a comb-like, parallel cross-like, tessellated, or concentric circle-like one when viewed from the top thereof.

Figure 3C:
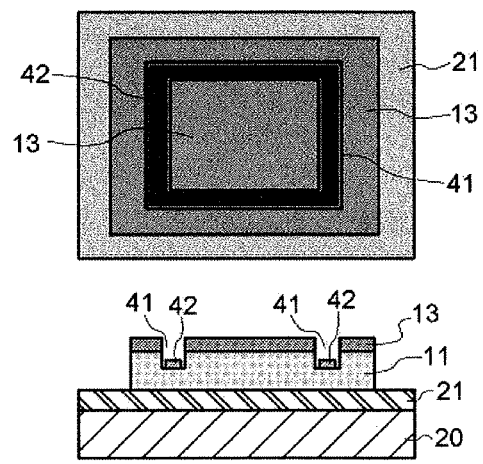

Next, as shown in FIG. 3(C), on the bottom face of the groove 41, an n-side first electrode 42 is formed. Since the plane on which the n-side first electrode 42 is directly formed is a growth plane for the n-type layer 11, it is generally a Ga polar plane. In this case, as the material of the n-side first electrode 42 that allows an ohmic contact to be provided, the same material as given in, for example, Patent Documents 1 and 2, however, it is preferable to use Cr/Ni/Au as later described. The geometry of the n-side first electrode 42 corresponds to that of the groove 41, being rectangular annular and having a width narrower than that of the groove 41. In this configuration, the n-side first electrode 42 is formed on the bottom face of the recess structure of the n-type GaN layer 11.

Figure 3D:
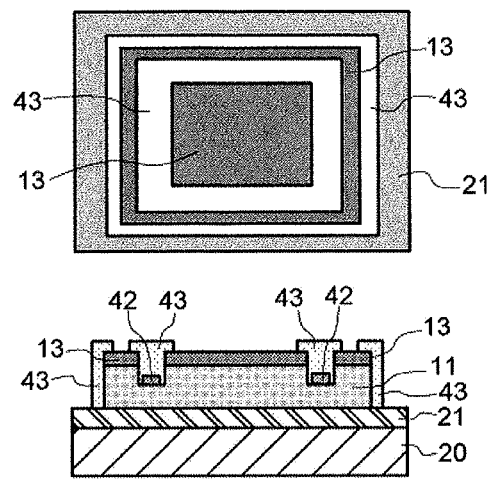

Next, as shown in FIG. 3(D), an insulating layer 43 is formed such that the groove 41 is filled up, and the ends of the p-type GaN layer 13 and n-type GaN layer 11 are covered. However, most of the surface of the p-type GaN layer 13 is left to be exposed. As the material of the insulating layer 43, for example, $SiO_2$, or the like, can be used which allows film formation in this configuration, and which is highly insulating. Patterning of the insulating layer 43 can be performed with the use of photolithography and etching. In filling up the groove 41, in order to improve the adhesion between the $SiO_2$ film and the electrode 42, a Ti layer may be deposited on the Au layer as an adhesion metal.

Figure 3E:
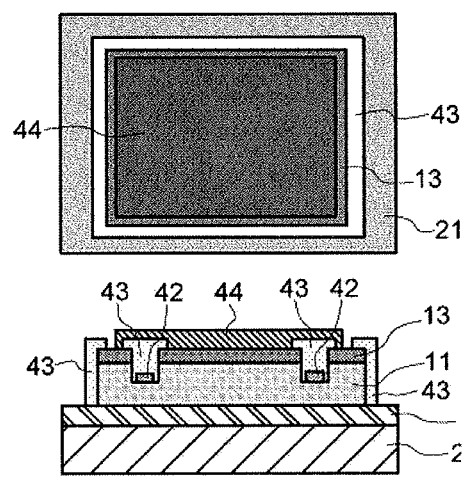

Next, as shown in FIG. 3(E), a p-side electrode 44 is formed such that the surface of the p-type GaN layer 13 and the insulating layer 43 on the groove 41 are covered. The surface on which the p-side electrode 44 is formed is the same as that in FIG. 1(C), and as the material thereof, Ag, or the like, can be used in the same manner. The patterning thereof, and the like, can also be performed in the same manner.

Figure 4F:
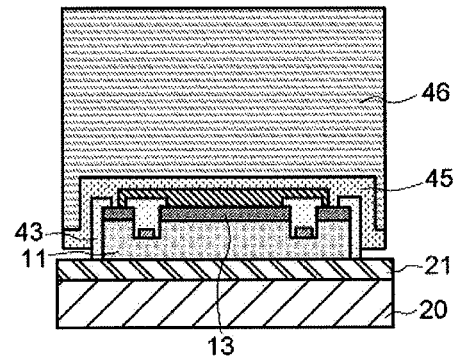
FIG. 4(F) to FIG. 4(I) are a second set of figures giving a top view (upper side) and a sectional view (lower side) for the respective steps illustrating the modification of the manufacturing method for a semiconductor device according to an embodiment of the present invention.

Next, as shown in FIG. 4(F), through a cap metal 45, a copper block 46 is connected to the entire surface on the side where the p-side electrode 44 is formed. This copper block 46 serves as a supporting structure portion of the semiconductor layer in the subsequent steps. The supporting structure portion may be formed by using the dry plating method or the wet plating method, or by the bonding method, which uses a bonding material in between the supporting structure portion and the cap metal. Further, the material of the supporting structure portion may be a metal, an alloy, or a semiconductor having a conductivity. The geometry of the supporting structure portion is preferably the same as that which is disclosed in the international application No. PCT/JP2009/069230.

Figure 4G:
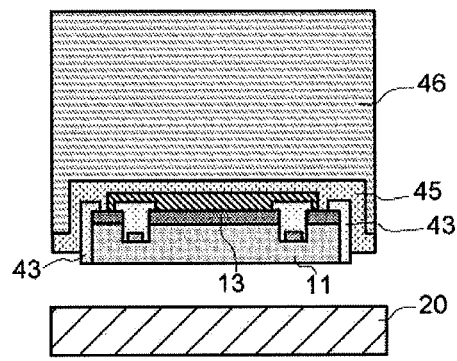
Figure 4H:
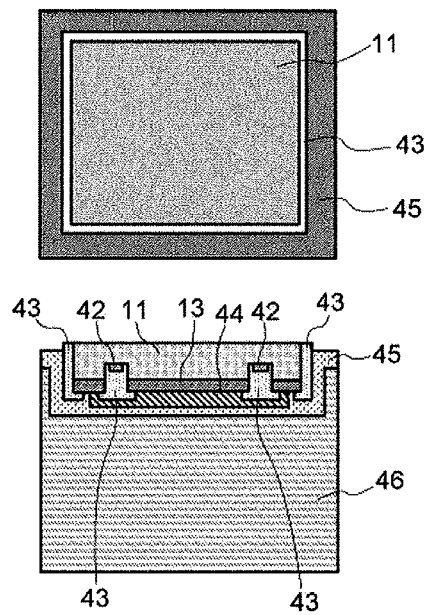

Next, as shown in FIG. 4(G), in the same manner as described above, the sapphire substrate 20 is separated by removing the lift-off layer 21 (the lift-off step). By doing this, the bottom face of the n-type GaN layer 11 is exposed. This plane is a nitrogen polar plane as described above. In FIG. 4(H), the posture in FIG. 4(G) is inverted.

Figure 4I:
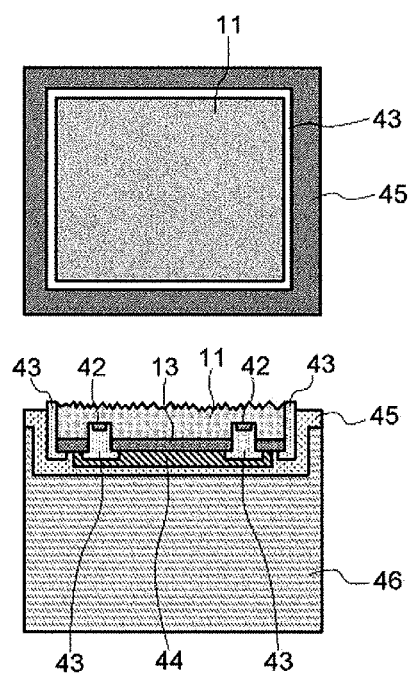

Next, as shown in FIG. 4(I), the same surface etching step as described with reference to FIG. 1(F) is performed (the surface etching step). By doing this, the nitrogen polar plane is etched, thereby irregularities in the shape of a six-sided pyramid that are each constituted by six {10-1-1} planes, which are semi-polar, are formed on the surface of the n-type GaN layer 11.

Figure 5J:
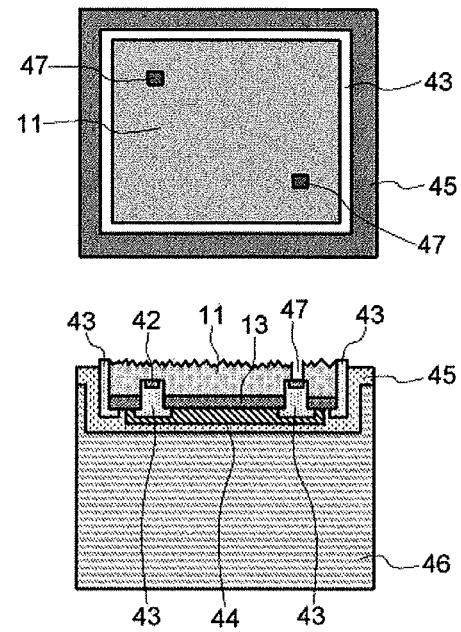
FIG. 5(J) and FIG. 5(K) are a third set of figures giving a top view (upper side) and a sectional view (lower side) for the respective steps illustrating the modification of the manufacturing method for a semiconductor device according to an embodiment of the present invention.

Next, as shown in FIG. 5(J), a contact hole 47 is formed in the n-type GaN layer 11 in two places which correspond to two apexes of the n-side first electrode 42, having a rectangular annular shape. On the bottom face of this contact hole 47, the n-side first electrode 42 is exposed. The step of forming the contact hole 47 is based on dry etching, however, since the Ni in the Cr/Ni/Au used as the material of the first electrode can play the role of an etch stop layer, the step is excellent in reproducibility of the etching stop. Cr or Cr alloy/Ti/Au and Ti/Al/Ti/Au, which have conventionally been used are poor in reproducibility of etch stop, and with Ti/Al/Ti/Au, an oxide film is formed when the Al layer is exposed, resulting in an increased resistance of contact with the second electrode, which poses a problem.

Figure 5K:
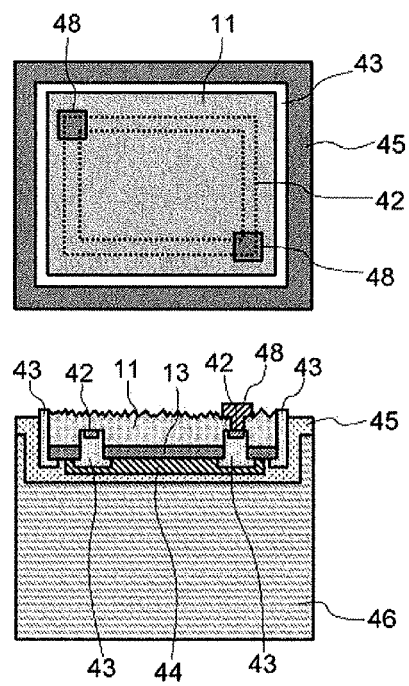
Figure 6A:
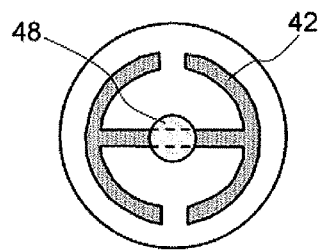
FIG. 6(A) to FIG. 6(G) give examples of configuration of an n-side first electrode and an n-side second electrode in the modification.
Figure 6B:
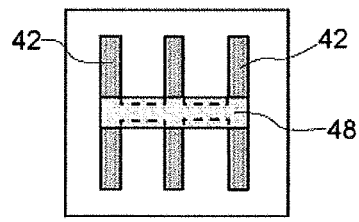
Figure 6C:
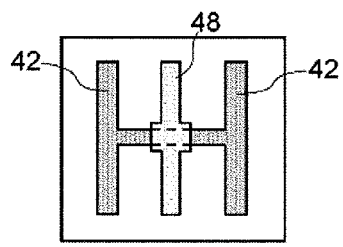
Figure 6D:
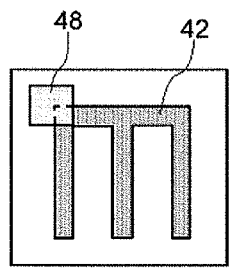
Figure 6E:
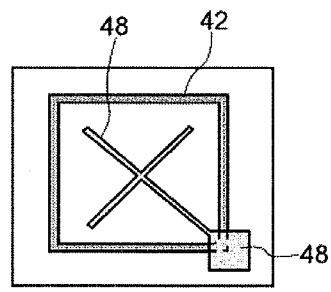
Figure 6F:
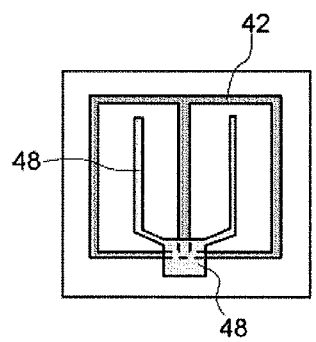
Figure 6G:
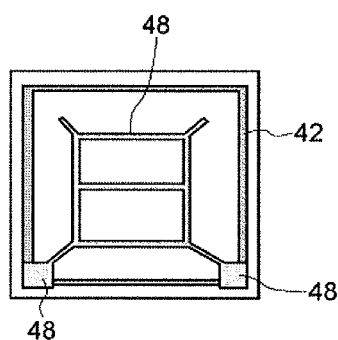

Next, as shown in FIG. 5(K), filling up the contact hole 47, and covering an area wider than this hole, an n-type second electrode 48 is formed (the electrode formation step).

For the n-type second electrode 48, the same material as that for the n-side electrode 12 in FIGS. 1(A) to 1(G) may be used. In other words, as the material which is suitable for the (10-1-1) plane, which is semi-polar, Ti/Ni/Au may be used. Since the Ni layer as the etch stop layer in the n-side first electrode 42 can maintain a clean surface, the n-side first electrode 42 can be bonded to the n-type second electrode 48 with ease, with the bonding portion being free from having an increased resistance due to oxidation.

In this structure, contact with the n-type GaN layer 11 can be made from the side of the Ga polar plane through the n-side first electrode 42, and from the side of the nitrogen polar plane through the n-type second electrode 48. For the side of the Ga polar plane, the n-side first electrode 42 formed of a Cr/Ni/Au material is used. On the other hand, on the side of the nitrogen polar plane, which is difficult to provide for a good ohmic contact, and yet is to be directly contacted with the n-type second electrode 48, the surface is transformed into that of {10-1-1} planes, which are semi-polar, and a Ti/Ni/Au layer structure is provided, whereby a good ohmic contact can be obtained. Thus, on either side, a good ohmic contact can be obtained, whereby, with the n-type GaN layer 11, a good ohmic contact can be made from both surface sides to lower the electrode resistance. On the other hand, through the p-side electrode 44, which has a sufficiently wide area, the cap metal 45, and the copper block 46, an electrical connection to the p-type GaN layer 13 can be made.

In this configuration, luminescence can be taken out from the top side in FIG. 5(K). Then, if the n-side first electrode 42 and the n-type second electrode 48 are configured as shown in FIG. 5(K), the area with which the n-type second electrode 48 obstructs the luminescence can be minimized, thereby a high luminescence efficiency can be achieved. Thus, a light-emitting device having good characteristics is provided. Further, as shown in FIGS. 6(A) to 6(G), the layout and geometry of the n-side first electrode 42 and n-type second electrode 48 can be modified as appropriate. The arrangement of the contact hole 47, and the like, can be set as appropriate in accordance with the layout and geometry.

Examples

Here is a description of the results of using the vacuum vapor deposition method (the degree of vacuum at the time of vapor deposition being $8\times10^{-4}$ Pa or under) to form an n-side electrode on the three different planes, i.e., the Ga polar plane, the nitrogen polar plane, and the semi-polar plane having irregularities in the shape of a six-sided pyramid, and examining the characteristics thereof.

As the growth substrate, a sapphire substrate (C-plane) was used, and on the sapphire substrate, a Cr layer (20 nm thick) was formed by the sputtering method, which was followed by making a nitriding treatment at 1080° C. in an ammonia atmosphere. Here, the nitridation was made in order to improve the crystallinity of the n-type GaN layer to be grown thereon and facilitate the lift-off. Thereafter, by the MOCVD method, an n-type GaN layer (Si doped, having a carrier density of approx. $5\times10^{18}$ cm$^{-3}$, with a thickness of 5 μm) was grown. On the surface of the n-type GaN layer after being grown, a surface etching step was taken using an aqueous solution of KOH with a concentration of 6 mols/L, however, the surface was practically not etched, the flatness being maintained, which indicated that this surface is a (0001) Ga plane.

Figure 7:
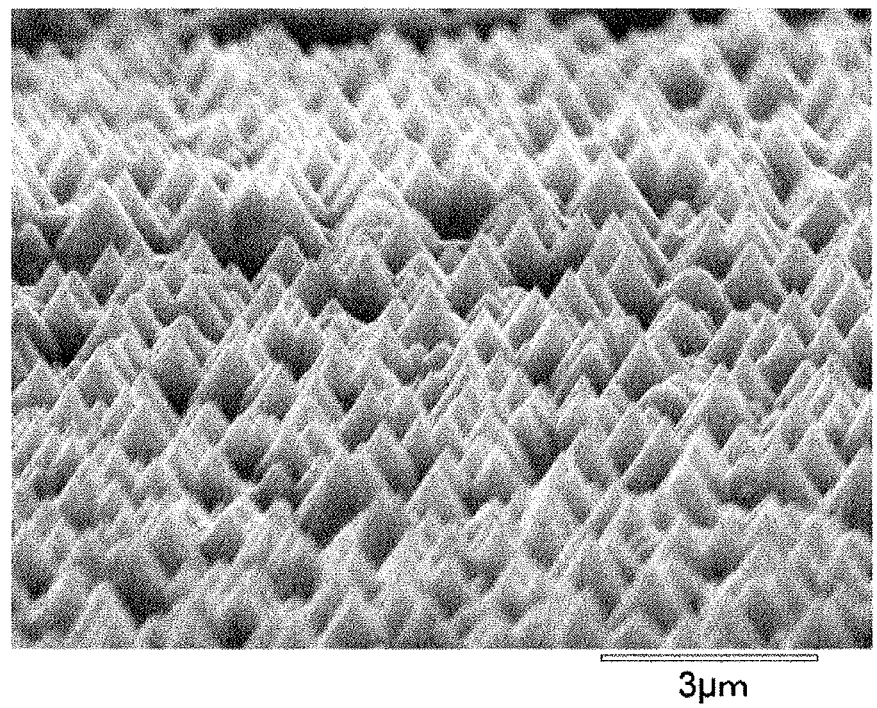
FIG. 7 is an SEM photo of the geometry after anisotropic etching of the surface in Example.

Thereafter, on the n-type GaN layer, a Cu layer (having a thickness of 150 μm) was vapor-deposited, which was followed by taking the lift-off step for selectively etching away the CrN layer to separate between the growth substrate and the epitaxial growth layer. The surface exposed after the lift-off step was a (000-1) N polar plane, contrarily to that as mentioned above. On this surface, an etching treatment was performed using an aqueous KOH solution of 6 mols/L in concentration for 30 min at 60° C. to obtain a surface geometry as shown in FIG. 7. The SEM observation of this surface geometry revealed that the irregularities are in the shape of a six-sided pyramid, and the triangular surface of the six-sided pyramid is at an angle of 62° of the (000-1) bottom face, therefore the surfaces constituting the six-sided pyramid are {10-1-1} planes.

On the three different surfaces formed as described above, i.e., the surface of the semi-polar plane, that of the (0001) Ga plane, which was not subjected to the etching step, and that of the (000-1) N plane, electrodes made of various materials were formed, and examined for the current-voltage characteristic at the contact by the TLM (Transmission Line Model) method. For using the TLM method, electrodes having a length of 400 μm and a width of 150 μm were formed with spacings of 20, 40, 80, and 160 μm being given. By abutting the needle of a prober against these electrode patterns, the current-voltage characteristic was determined. As is well known, by using the TLM method, it is possible to calculate the contact resistance, and the like, on the basis of the relationship between the resistance value obtained in determining the current-voltage characteristic and the electrode spacing. In order to avoid occurrence of an error due to the contact resistance between the prober needle and the electrode, the four-probe method was used.

Here, two different types of electrode material, i.e., Cr/Ni/Au and Ti/Ni/Au were used. Here, the former provides a laminate structure with which the Cr layer is directly contacted with the semiconductor layer, while the latter providing that with which the Ti is brought into direct contact with the semiconductor layer. Each as-deposited sample was subjected to a heat treatment in the nitrogen atmosphere at 250° C. and 400° C. for 10 min to evaluate the thermal stability of the ohmic property. FIGS. 8(A) to 8(F) shows the current-voltage characteristics obtained in the case where the electrode spacing was 80 μm, FIG. 8(A) to FIG. 8(C) being for Cr/Ni/Au, with the sample not subjected to a heat treatment after the film formation (as deposited), and those subjected to a heat treatment at 250° C. and 400° C., respectively. With this metal lay-up configuration, it can be known that, on the Ga polar plane, a good linearity is exhibited from the as-deposited state to the 400° C. heat-treated state with a sufficiently low contact resistance being obtained. However, on the N polar plane, a rectifying action is exhibited with the ohmic property being deteriorated by a heat treatment at 250° C. and 400° C. On the semi-polar plane, a linearity is exhibited in the as-deposited state, but the contact resistance is high as compared to that on the Ga polar plane. In addition, it can be seen that, by a heat treatment at 250° C. and 400° C., the ohmic property is deteriorated. For the semi-polar plane, the current-voltage characteristic curve is between those for the Ga polar plane and the N polar plane.

Figure 8A:
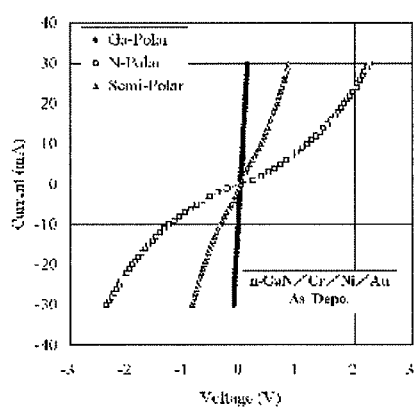
FIG. 8(A) to FIG. 8(C) give the heat treatment temperature dependency of the current-voltage characteristic of a Cr/Ni/Au electrode formed on the Ga polar plane, the N polar plane, and the semi-polar plane, FIG. 8(A) being that in the as-deposited state, FIG. 8(B) being that after heat treatment at 250° C., and FIG. 8(C) being that after heat treatment at 400° C., while FIG. 8(D) to FIG. 8(F) give the heat treatment temperature dependency of the current-voltage characteristic of a Ti/Ni/Au electrode, FIG. 8(D) being that in the as-deposited state, FIG. 8(E) being that after heat treatment at 250° C., and FIG. 8(F) being that after heat treatment at 400° C.
Figure 8B:
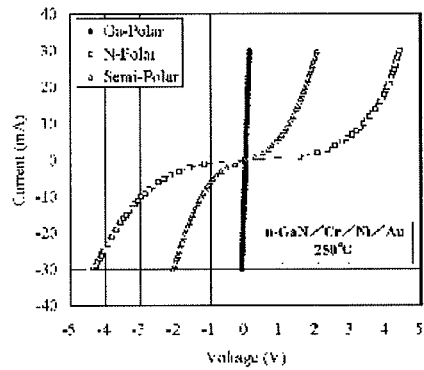
Figure 8C:
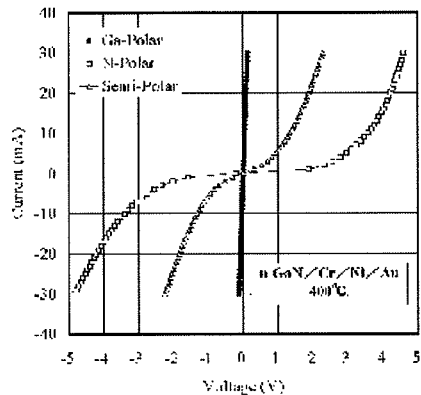
Figure 8D:
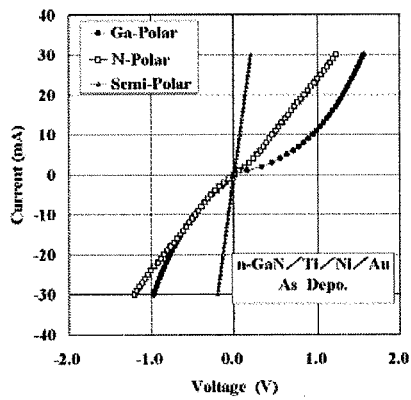
Figure 8E:
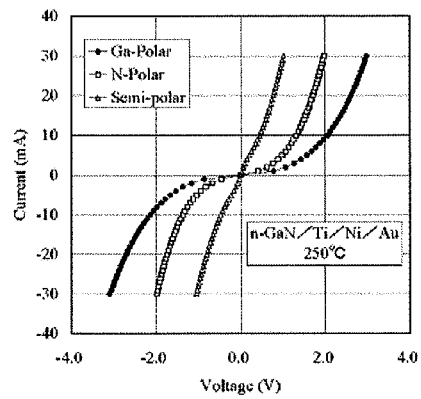
Figure 8F:
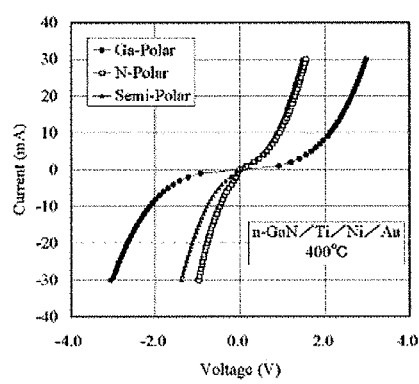
Figure 9A:
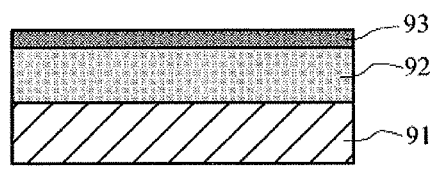
FIG. 9(A) and FIG. 9(B) show a simplified manufacturing method for an example of conventional light-emitting device.
Figure 9B:
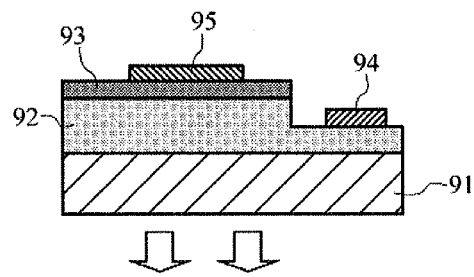

On the other hand, with Ti/Ni/Au, it is indicated, as shown in FIG. 8(D), that, on the semi-polar plane, a good linearity is obtained in the as-deposited state, a good ohmic property being achieved. Even in the 250° C. heat-treated state, a certain degree of linearity is given as shown in FIG. 8(E). Generally, since a package sealed with a silicone resin, which is highly heat resistant, is rated at a maximum operating temperature of 150° C. or so, the device will rarely be used at a temperature of over 150° C., and therefore it can be judged that the level of the linearity exhibited will pose no problem for serviceability as an electrode. On the Ga polar plane, there occurs a rectifying action as shown in FIG. 8(D) to FIG. 8(F), for example, a good ohmic property being not obtained. On the N polar plane, the resistance value is low as compared to that on the Ga polar plane, however, it is indicated that the ohmic property is poor, as compared to that on the semi-polar plane. Rather, since the n-side electrode is formed at the final stage following the lift-off, there is no necessity for applying heat to the device after the n-side electrode formation. Therefore, from the viewpoint of practical use, it is preferable that the ohmic property can be obtained in, for example, the as-deposited state to the 250° C. heat-treated state, and the metal lay-up configuration which needs a heat treatment at a higher temperature of, for example, 400° C. to provide the ohmic property is not appropriate because there occur problems, such as that of diffusion in, for example, the p-side electrode, which is formed before the n-side electrode, and the bonding portion, and that of peeling-off due to the difference in coefficient of thermal expansion between the Cu block as the supporting structure portion and the Group-III nitride semiconductor.

The TLM method was used to calculate the contact resistance ρc in the as-deposited state to find that, with the electrode formed of Cr/Ni/Au (FIG. 8(A)), a good ohmic contact was obtained on the Ga plane, the contact resistance being $4\times10^{-4}$ Ω·cm$^2$. On the other hand, with the electrode formed of Ti/Ni/Au (FIG. 8(D)), a good ohmic contact was obtained only on the semi-polar plane, the contact resistance being as low as $2\times10^4$ Ω·cm$^2$.

In this way, on the Ga polar plane, only with one of the electrode materials, i.e., Cr/Ni/Au, a good ohmic property (a low contact resistance Rc) was obtained, and on the N polar plane, with either of the electrode materials, a good ohmic property could not obtained. On the N polar plane, with the electrode formed of Ti/Ni/Au, a linearity was provided in the as-deposited state, but the resistance value given was higher than that on the semi-polar plane, being not practicable. Contrarily to these, with the electrode formed of Ti/Ni/Au on the semi-polar plane, the lowest value of contact resistance was obtained. Table 1 gives the contact resistance ρc for these series of samples. Since all of the samples did not always exhibit a linearity, the contact resistance ρc has been calculated based on the resistance value for a current value of 20 mA.

TABLE 1

| Electrode Structure | Polarity | Contact Resistance ρc (Ω · cm$^2$) | | |
| --- | --- | --- | --- | --- |
| | | As Depo. | 250° C. | 400° C. |
| Cr/Ni/Au | Ga-Polar | $4.3 \times 10^{-4}$ | $3.9 \times 10^{-3}$ | $4.4 \times 10^{-4}$ |
| | N-Polar | $2.8 \times 10^{-2}$ | $2.7 \times 10^{-2}$ | $6.6 \times 10^{-2}$ |
| | Semi-Polar | $9.9 \times 10^{-3}$ | $3.8 \times 10^{-2}$ | $2.6 \times 10^{-2}$ |
| Ti/Ni/Au | Ga-Polar | $3.9 \times 10^{-2}$ | $4.0 \times 10^{-2}$ | $4.0 \times 10^{-2}$ |
| | N-Polar | $1.3 \times 10^{-2}$ | $2.5 \times 10^{-2}$ | $3.7 \times 10^{-3}$ |
| | Semi-Polar | $2.0 \times 10^{-4}$ | $1.4 \times 10^{-3}$ | $4.3 \times 10^{-3}$ |

Figure 10A:
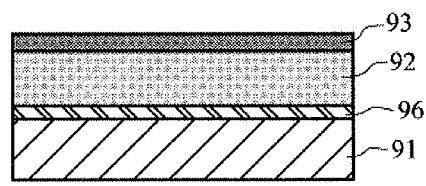
FIG. 10(A) to FIG. 10(C) show a simplified manufacturing method for another example of conventional light-emitting device.
Figure 10B:
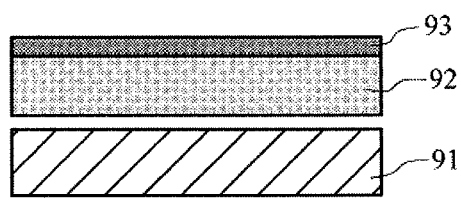
Figure 10C:
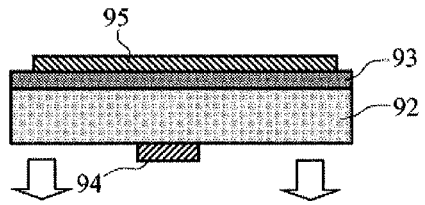

This result indicates that, by making anisotropic etching on the nitrogen polar plane for formation of irregularities constituted by semi-polar planes, and forming an electrode thereon, the ohmic contact can be easily provided. Therefore, for example, in the case where, for a semiconductor device having a structure as shown in FIG. 1(G), the electrode 12 is formed of a material of Ti/Ni/Au, the contact resistance can be decreased, whereby the forward drive voltage Vf can be reduced. Further, for example, for a semiconductor device having a structure as shown in FIG. 5(K), the n-side first electrode 42 can be formed of a material of Cr/Ni/Au to provide a good ohmic contact with the Ga polar plane. In the case where the n-type second electrode 48 is formed of a material of Ti/Ni/Au, the contact resistance can be particularly decreased, whereby the area of the n-side electrode can be minimized for enhancing the efficiency of the light-emitting device. With a large-sized semiconductor device having a device area of 0.25 mm$^2$ or over, in order to make the density of electric current flowing in the device more uniform, an auxiliary electrode for distribution is generally installed in addition to the bonding pad or the bump electrode for connection to the outside of the device. In that case, the n-side first electrode 42 may be adapted to be a main distribution electrode, with the n-type second electrode 48 being adapted to be an auxiliary distribution electrode. Also in that case, the area of the electrode on the device surface can be minimized, whereby the shielding of the light by the electrode can be reduced, with the light-emitting device being made more efficient. In addition, as shown in FIGS. 10(A) to 10(B), it is possible to make a combination or a modification for the layout of the first electrode and the second electrode.

Further, in the above example, GaN was used, however, for $Al_{0.7}Ga_{0.3}N$, the same result was obtained. In this way, even if the epitaxial growth layer contains Al, B or In as a Group-III element, or any other n-type dopant is used, the same structure can be used.

As the ohmic electrode for the n-type nitride semiconductor, a Ti/Al electrode was formed on the Ga polar plane, the nitrogen polar plane, and the semi-polar plane. The film thicknesses of the Ti and Al layers were specified to be 20 nm and 300 nm, respectively. The other specifications were the same as those for the above Example. In the as-deposited state, the current-voltage characteristics obtained indicated a good linear relationship for either of the Ga polar plane, the nitrogen polar plane, and the semi-polar plane, the ohmic property being good. However, the contact resistance value ρc was $6\times10^{-5}$ Ω·cm$^2$ on the Ga polar plane, $4\times10^{-4}$ Ω·cm$^2$ on the nitrogen polar plane, and $6\times10^{-4}$ Ω·cm$^2$ on the semi-polar plane, the nitrogen polar plane and the semi-polar plane providing a value higher by approx. one order of magnitude than that provided on the Ga polar plane, with the semi-polar plane giving the highest resistance. The evaluation after the 250° C. heat treatment revealed that the sample of Ga polar plane exhibited a contact resistance value of $1\times10^{-3}$ Ω·cm$^2$, that of nitrogen polar plane exhibited $6\times10^{-3}$ Ω·cm$^2$, and that of semi-polar plane exhibited $5\times10^{-3}$ Ω·cm$^2$, the values of contact resistance being increased, with the Ga polar plane maintaining the ohmicity, while the nitrogen polar plane and the semi-polar plane having lost the ohmicity with the linearity being deteriorated. From the above examination, it has been reconfirmed that the Ti/Al electrode can be served for practical use as an ohmic electrode on the Ga polar plane. However, it has been revealed that, in the case where this electrode is used as the n-side first electrode 42 in a semiconductor device having a structure shown in FIG. 5(K), the Ti layer tends to be easily etched away as compared to the Ni layer in dry etching for formation of a through-hole, giving a poor reproducibility of etch stop, with the oxide film on the Al surface that is produced with the oxygen in the atmosphere during the process having an ill effect on the contact resistance to the n-type second electrode 48, increasing the resistance value. In addition, it has been revealed that, in the case where the Ti/Al electrode is applied to a nitrogen polar plane or a semi-polar plane, it exhibits a poor resistance value, as compared to the Ti/Ni/Au electrode applied to the semi-polar plane, and further it poses a problem of heat resistance.

Accordingly, it has been found that the Ti/Al-based electrode which has conventionally been used on the Ga polar plane is not suited for use on the side of the Ga polar plane having a structure as shown in FIG. 5(K). And, as described above, it has been indicated that especially the Ti/Ni/Au material provides a good ohmic contact in the case where an n-side electrode is formed thererof on the semi-polar plane, and using this electrode, a semiconductor device can be manufactured which provides a good n-side electrode on the side where the growth substrate has been removed.

DESCRIPTION OF SYMBOLS 11, 92: n-type GaN layer (n-type Group-III nitride semiconductor layer)
12, 94: n-side electrode (one electrode)
13: p-type GaN layer (p-type Group-III nitride semiconductor layer)
14, 44, 95: p-side electrode 20: sapphire substrate (growth substrate)
21, 96: lift-off layer
31, 45: cap metal
32, 46: copper block
41: groove
42: n-side first electrode (another electrode)
43: insulating layer
47: contact hole
48: n-type second electrode (one electrode)

The invention claimed is:

1. A semiconductor device, comprising a plurality of electrodes, one electrode of the plurality of electrodes being formed on a surface constituted by a semi-polar plane on the side of one principal plane in an n-type Group-III nitride semiconductor layer, and another electrode of the plurality of electrodes that is connected to the one electrode being formed on the side of the other principal plane in the n-type Group-III nitride semiconductor layer.

2. The semiconductor device according to claim 1, wherein the semi-polar plane is constituted by {10-1-1} planes.

3. The semiconductor device according to claim 2, wherein the surface is formed by anisotropic chemical etching of a nitrogen polar plane of the n-type Group-III nitride semiconductor, and the surface of the n-type Group-III nitride semiconductor device has irregularities constituted by the semi-polar plane.

4. The semiconductor device according to claim 3, wherein the n-type Group-III nitride semiconductor layer is a single crystal which has been formed by epitaxial growth on a growth substrate, and
the nitrogen polar plane is a plane on the side of the growth substrate, the plane having been obtained by separating between the n-type Group-III nitride semiconductor layer and the growth substrate after the epitaxial growth.

5. The semiconductor device according to claim 1, wherein the one electrode has a structure in which titanium (Ti), nickel (Ni), and gold (Au) layers have been sequentially laminated on the semi-polar plane of the n-type Group-III nitride semiconductor layer.

6. The semiconductor device according to claim 1, wherein electric current is flown from the one electrode in a direction perpendicular to the principal plane in the surface for operation of the semiconductor device.

7. The semiconductor device according to claim 1, wherein the another electrode is formed on a bottom face of a recess structure formed on the side of the Ga polar plane in the Group-III nitride semiconductor.

8. The semiconductor device according to claim 1, wherein the another electrode contains nickel (Ni).

9. The semiconductor device according to claim 1, wherein the another electrode has a structure in which chromium (Cr), nickel (Ni), and gold (Au) layers are sequentially laminated.

10. A manufacturing method for a semiconductor device in which an n-type Group-III nitride semiconductor layer is used, comprising:
a growth step of epitaxially growing the n-type Group-III nitride semiconductor layer on a growth substrate;
a lift-off step of separating between the n-type Group-III nitride semiconductor layer and the growth substrate for exposing a plane on the side of the growth substrate in the n-type Group-III nitride semiconductor layer;
a surface etching step of anisotropic chemical etching on the plane on the side of the growth substrate in the n-type Group-III nitride semiconductor layer for forming a surface in which a semi-polar plane is exposed in the plane on the side of the growth substrate in the n-type Group-III nitride semiconductor layer; and
an electrode formation step of forming an electrode on the surface.

11. The manufacturing method for a semiconductor device according to claim 10, wherein the anisotropic etching in the surface etching step is wet etching using an alkaline solution.

12. The manufacturing method for a semiconductor device according to claim 10, wherein, in the growth step, the n-type Group-III nitride semiconductor layer is formed on the growth substrate through a lift-off layer; and
in the lift-off step, by selectively etching the lift-off layer, the n-type Group-III nitride semiconductor layer and the growth substrate are separated from each other.

13. The manufacturing method for a semiconductor device according to claim 10, further comprising a second electrode formation step of forming a second electrode on another plane in the n-type Group-III nitride semiconductor layer.

* * * * *